US 8,264,607 B2

(12) United States Patent
Chen et al.

(10) Patent No.: US 8,264,607 B2
(45) Date of Patent: Sep. 11, 2012

(54) METHOD OF SAMPLING PHASE CALIBRATION AND DEVICE THEREOF

(75) Inventors: Chian-Wen Chen, Taipei (TW); Wei-Lung Lu, Hsinchu (TW); Jui-Yao Lee, Hsinchu County (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 218 days.

(21) Appl. No.: 12/883,182

(22) Filed: Sep. 16, 2010

(65) Prior Publication Data

US 2011/0304768 A1 Dec. 15, 2011

(30) Foreign Application Priority Data

Jun. 9, 2010 (TW) ................................ 99118747 A (51) Int. Cl.
*H03L 7/00* (2006.01)
(52) U.S. Cl. ........ 348/537; 348/572; 348/536; 348/739; 348/524; 348/543; 348/544; 375/155; 375/362; 375/373; 375/376
(58) Field of Classification Search .................. 348/537, 348/572, 536, 739, 524, 543, 544; 375/355, 375/362, 373, 376; 345/520
See application file for complete search history.

(56) References Cited

U.S. PATENT DOCUMENTS

| 5,486,867 A * | 1/1996 | Hsu et al. ...................... 348/516 |
| 5,805,233 A * | 9/1998 | West ............................. 348/537 |
| 6,340,993 B1 * | 1/2002 | Hasegawa et al. ............ 348/572 |
| 7,535,982 B2 * | 5/2009 | Chou et al. ..................... 375/355 |
| 7,633,494 B2 * | 12/2009 | Na ................................ 345/204 |
| 7,825,990 B2 * | 11/2010 | Ouyang et al. ................ 348/572 |
| 2009/0219238 A1 * | 9/2009 | Furuya et al. .................. 345/87 |

* cited by examiner

*Primary Examiner* — Jeffrey Harold
*Assistant Examiner* — Mustafizur Rahman
(74) *Attorney, Agent, or Firm* — Jianq Chyun IP Office (57) ABSTRACT

A method of sampling phase calibration and a device thereof is suitable for an analog-to-digital converter and phase lock loop (ADC-PLL). The ADC-PLL conducts sampling on a periodic analog signal according to a sampling phase so as to produce a plurality of digital signals. The sampling phase calibration device includes a storage unit, a motion-detecting unit and a control unit. The motion-detecting unit is to calculate the number of motion data corresponding to a sampling phase. The control unit is coupled to the motion-detecting unit for changing the sampling phase so as to obtain the number of motion data corresponding to each sampling phase and selecting the sampling phase corresponding to the minimum number of motion data as an optimal sampling phase. The ADC-PLL can correctly sample an analog signal by using the optimal sampling phase and reduce the influence of clock jitter to the minimum.

10 Claims, 7 Drawing Sheets

METHOD OF SAMPLING PHASE CALIBRATION AND DEVICE THEREOF

CROSS-REFERENCE TO RELATED APPLICATION

This application claims the priority benefit of Taiwan application serial no. 99118747, filed on Jun. 9, 2010. The entirety of the above-mentioned patent application is hereby incorporated by reference herein and made a part of this specification.

BACKGROUND OF THE INVENTION

1. Field of the Invention

The present invention generally relates to a sampling phase technique of an analog-to-digital converter and phase lock loop (ADC-PLL), and more particularly, to a sampling phase technique where a number of motion data between periodic digital signals (e.g., texture images) is used as the calibration base of the sampling phase.

2. Description of Related Art

When an ADC-PLL is sampling, it would be interfered by clock jitter, which further affects the quality of the obtained digital signal. Hence, it is needed to calibrate the sampling phase of the ADC-PLL so as to correctly sample analog signals.

Figure 1:
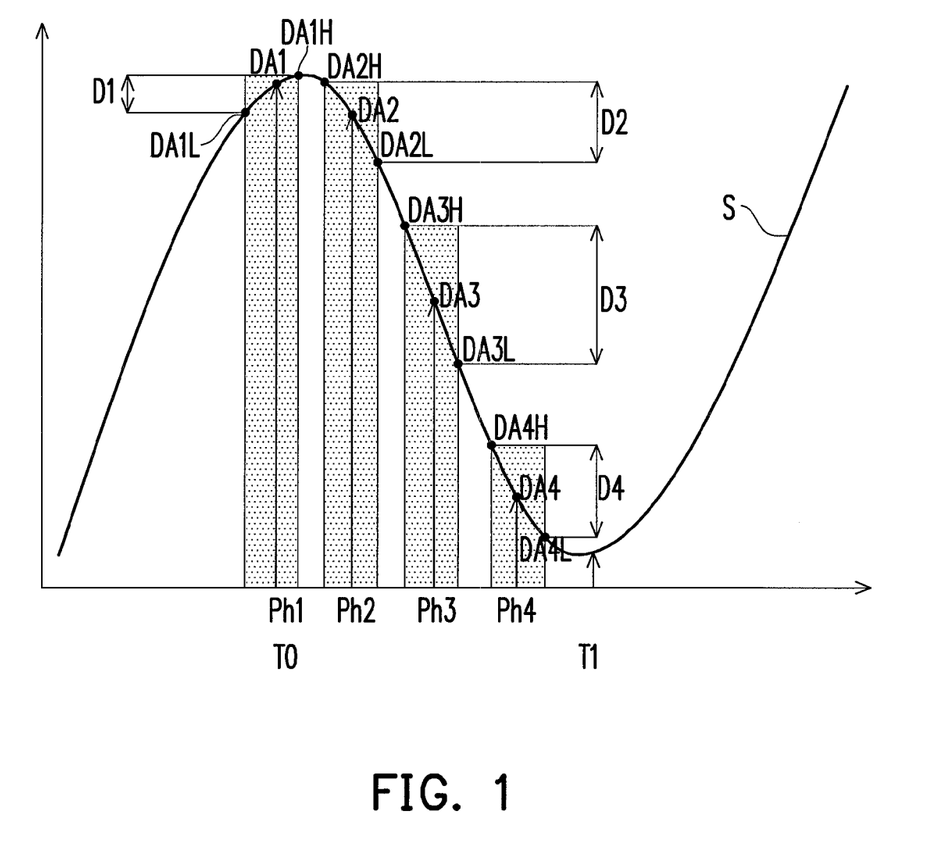
FIG. 1 is a diagram showing the influence of clock jitter on the sampling of an ADC-PLL in the prior art.

FIG. 1 is a diagram showing the influence of clock jitter on the sampling of an ADC-PLL in the prior art. Referring to FIG. 1, an ADC-PLL conducts sampling on an analog signal of FIG. 1. Assuming the ADC-PLL samples once per a duration T0-T1 on an analog signal S, the ADC-PLL in the embodiment has four sampling phases ph1, ph2, ph3 and ph4. If the ADC-PLL is in an ideal status (i.e., no clock jitter), the ADC-PLL can exactly conduct sampling at the point DA1, DA2, DA3 or DA4 according to one of four sampling phases, i.e., according to one of the sampling phase ph1, the sampling phase ph12, the sampling phase ph3 or the sampling phase ph4. In fact, due to the interference of clock jitter, taking the sampling phase ph1 as an example, the ADC-PLL may sample a point between the highest sampling point DA1H and the lowest sampling point DA1L in a range D1, not the expected sampling point DA1. Analogically for the rest, when the ADC-PLL samples the analog signal S according to the sampling phase ph2, ph3 or ph4, the sampled point might be any one point in the range D2, D3 or D4. Since the information variation in the range D1 is smaller, the variation of the digital information obtained after the sampling is accordingly smaller. However, in the range D2, D3 or D4, the information variation may be excessive so that the variation of the digital information obtained after the sampling is too large to conduct a better sampling on the analog signal S. Hence, the sampling phase of the ADC-PLL should be calibrated to get an optimal sampling phase ph1 by the sampling phase calibration technique so as to reduce the influence of clock jitter during sampling to the minimum.

In the conventional sampling phase calibration technique, every sampling phase is used to conduct sampling, and a sampling phase corresponding to the maximum sum of absolute difference (SAD) between the sampling results serves as the optimal sampling phase. However, when the clock jitter is larger, the above-mentioned optimal sampling phase in the prior art would lead to incorrect sampling or instability of the sampling quality.

SUMMARY OF THE INVENTION

Accordingly, the present invention is directed to a method of sampling phase calibration, which is able to calibrate the sampling phase of an ADC-PLL. With the method, the optimal sampling phase is found out by obtaining the number of motion data through a calculation between periodic digital signals (e.g., text images) and the sampling phase is calibrated according to the optimal sampling phase.

In addition, the present invention is also directed to a sampling phase calibration device, which can find out the optimal sampling phase by obtaining the number of motion data through a calculation between texture images and conduct sampling by using the optimal sampling phase to set the ADC-PLL.

The present invention provides a method of sampling phase calibration suitable to an ADC-PLL. The method includes following steps. First, the sampling phase is set with a first preset phase value, and sampling is conducted according to the sampling phase on a periodic static high-frequency analog signal (e.g., a component video/PC signal) so as to produce a plurality of digital signals, wherein every digital signal includes a plurality of pixel data. Next, the quantity of cases among the above-mentioned digital signals is calculated so as to obtain the number of motion data corresponding to this sampling phase, wherein the case means the difference between the pixel data with same corresponding positions among the above-mentioned digital signals is greater than a first threshold. Then, the above-mentioned sampling phase is changed so as to obtain the number of motion data corresponding to each of the sampling phases. Finally, the sampling phase corresponding to the minimum number of motion data or one of the sampling phases respectively corresponding to a number of motion data less than a second threshold is set as the optimal sampling phase.

The present invention also provides a sampling phase calibration device, wherein the device is coupled to an ADC-PLL, and the ADC-PLL conducts sampling on a static high-frequency component video/PC signal according to a sampling phase so as to produce a plurality of digital signals. Each digital signal includes a plurality of pixel data. The sampling phase calibration device includes a storage unit, a motion-detecting unit and a control unit. The storage unit receives and saves the above-mentioned pixel data. The motion-detecting unit is coupled to the storage unit to calculate the quantity of cases so as to obtain the number of motion data corresponding to a sampling phase, wherein the case means the difference between the pixel data with same corresponding positions among the digital signals is greater than a first threshold. The control unit is coupled to the motion-detecting unit for changing the sampling phase so as to obtain the number of motion data corresponding to each sampling phase and selecting the sampling phase corresponding to the minimum number of motion data or one of the sampling phases respectively corresponding to a number of motion data less than a second threshold as an optimal sampling phase.

Based on the depiction above, in the embodiment of the present invention, a same sampling phase is used to conduct multiple samplings on a static high-frequency component video/PC signal to produce a plurality of periodic digital signals, and a motion-detecting unit is used to calculate the number of motion data, wherein the pixel data with same corresponding positions among the periodic digital signals have considerable difference therebetween. The control unit changes the sampling phase to obtain the number of motion data corresponding to each of the sampling phases and selects the sampling phase corresponding to the minimum number of motion data or one of the sampling phases respectively corresponding to a number of motion data less than a threshold as the optimal sampling phase, so that the ADC-PLL can correctly conduct sampling on the analog signal by using the optimal sampling phase and reduce the influence of clock jitter to the minimum.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2:
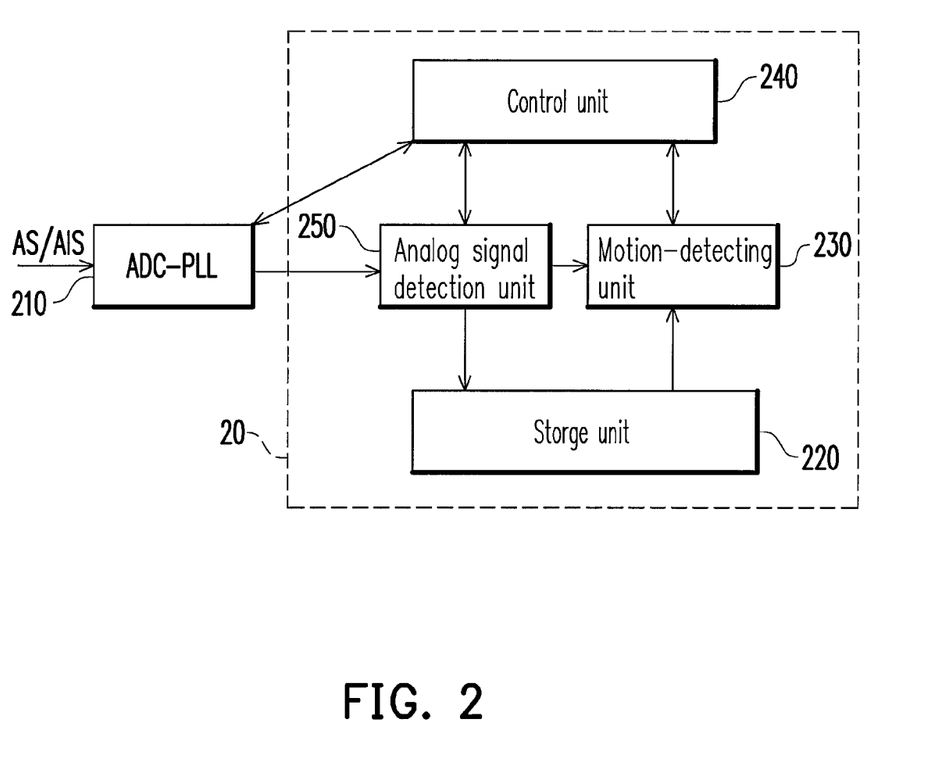
FIG. 2 is a block diagram of a sampling phase calibration device according to an embodiment of the present invention.

FIG. 2 is a block diagram of a sampling phase calibration device 20 according to an embodiment of the present invention. Referring to FIG. 2, a sampling phase calibration device 20 is coupled to an ADC-PLL 210. The ADC-PLL 210 conducts sampling on a periodic analog signal AS according to the sampling phase controlled by a control unit 240 so as to produce a plurality of digital signals DS (not shown), wherein each digital signal DS includes a plurality of pixel data. The periodic analog signal AS of the embodiment is a static (i.e., the frame-to-frame difference is small) and high-frequency or texture rich (i.e., the frequency response of this image is larger in high frequency portion) component video/PC/PC signal. In addition, the user using the embodiment can make the ADC-PLL 210 have a plurality of sampling phases by design according to the application requirement to increase the sampling quality. In the embodiment, the ADC-PLL 210 has 32 sampling phases, while in other embodiments, the ADC-PLL 210 can have 8 or 64 sampling phases, which the present invention is not limited to. The sampling phase calibration device 20 includes a storage unit 220, a motion-detecting unit 230 and a control unit 240. The storage unit 220 receives and saves the digital signal DS obtained by sampling of the ADC-PLL 210. The motion-detecting unit 230 is coupled to the storage unit 220 to make subtractions between the pixel data of two adjacent sampling time in an input image digital signal DS respectively having the same corresponding position and calculates the number of the cases that the difference of the pixel data is greater than a first threshold so as to obtain the number of motion data corresponding to the sampling phase.

Continuing to FIG. 2, the control unit 240 is coupled to the motion-detecting unit 230 and the ADC-PLL 210, and the control unit 240 obtains the numbers of motion data corresponding to every sampling phase by changing the sampling phase. After obtaining the numbers of motion data corresponding to all the sampling phases, the control unit 240 selects the sampling phase corresponding to the minimum number of motion data or one of the sampling phases respectively corresponding to a number of motion data less than a second threshold TH2 as an optimal sampling phase, so that the ADC-PLL 210 can conduct sampling on the analog signal AS by using the optimal sampling phase to reduce the influence of clock jitter to the minimum.

In the embodiment, the sampling phase calibration device 20 further includes an analog signal detection unit 250, which is coupled to the storage unit 220, the motion-detecting unit 230 and the control unit 240. The analog signal detection unit 250 is for detecting the analog signal AS. When the analog signal AS is a high-frequency signal, and the difference of the input analog signal AS between two frames (or the fields) corresponding to two adjacent sampling time is less than an evaluation value, i.e., the analog signal AS is static and high-frequency which meets the criteria of the embodiment, the control unit starts calibration on the sampling phase. The embodiment includes the analog signal detection unit 250, which the present invention is not limited to. If the input analog signal AS is an analog input signal qualified for calibration, the analog signal detection unit 250 can be omitted.

In order to make anyone skilled in the art more understand the present invention, the periodic analog signal AS herein is, for example, an analog image signal AIS, and the embodiment is depicted in detail with the analog image signal AIS. Accordingly, the digital signal DS is a digital image signal DIS, wherein the image signal of each period is an image frame or image field. The pixel data with the same corresponding positions among the digital signals DS are the pixel data with the same horizontal and vertical positions among the digital image signal DIS. However, the present invention is not limited to the analog image signal. In other embodiments, the periodic analog signal AS can be an audio analog signal or other periodic analog signal affected by clock jitter.

Figure 3:
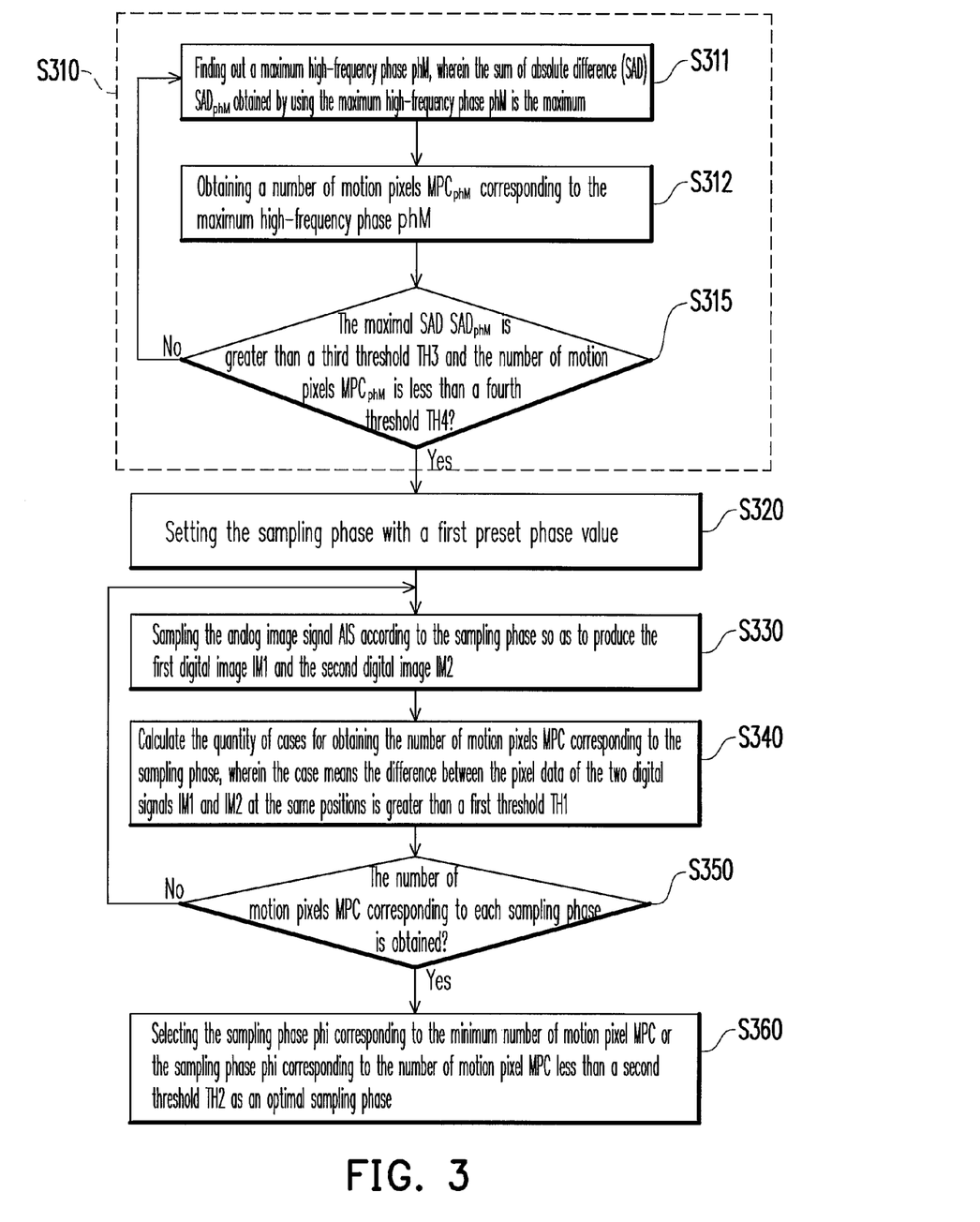
FIG. 3 is a flow chart showing a method of sampling phase calibration according to an embodiment of the present invention.

The operation flow of the embodiment can refer to FIGS. 2 and 3. FIG. 3 is a flow chart showing a method of sampling phase calibration according to an embodiment of the present invention. First in step S310, the analog signal detection unit 250 detects a periodic analog image signal AIS (one example of the analog signal AS). When the analog image signal AIS is a high-frequency signal and the difference of the pixel data between each analog image field in the analog image signal AIS is less than an evaluation value (i.e., as an example, the difference of the frame/field input analog signals between two adjacent sampling time is less than the evaluation value), the flow enters to step S320 to start calibration on the sampling phase. It should be noted that the present invention can use any possible method to detect the periodic analog image signal AIS and thereby start calibration on the sampling phase.

Figure 4:
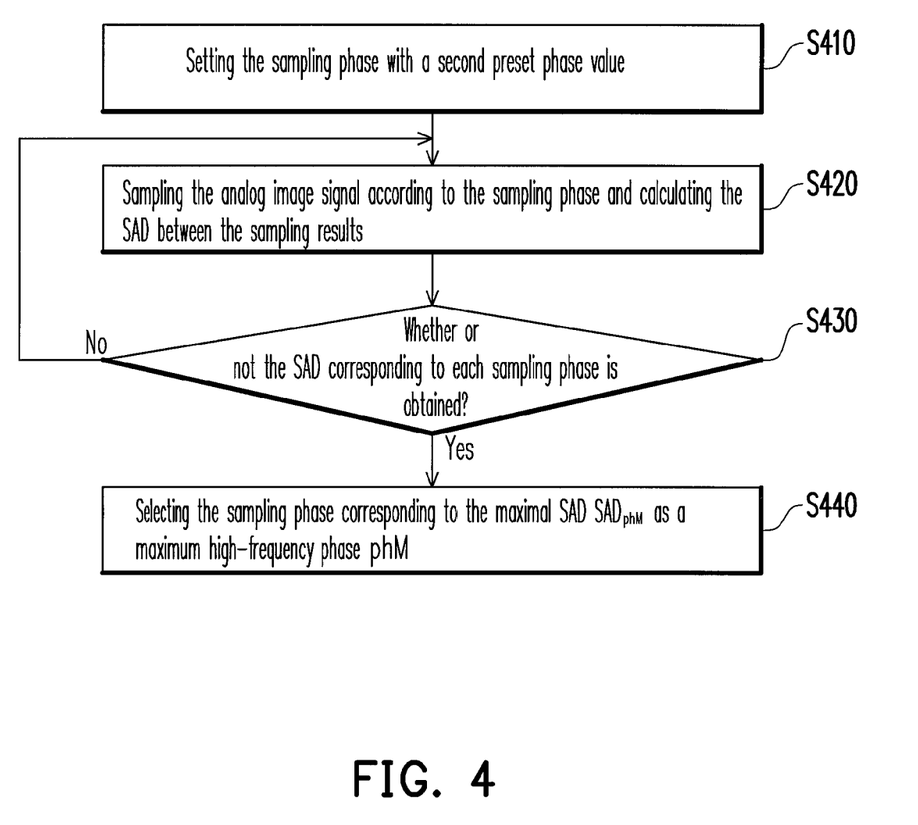
FIG. 4 is a method flow chart of step S331 of FIG. 3.
Figure 5:
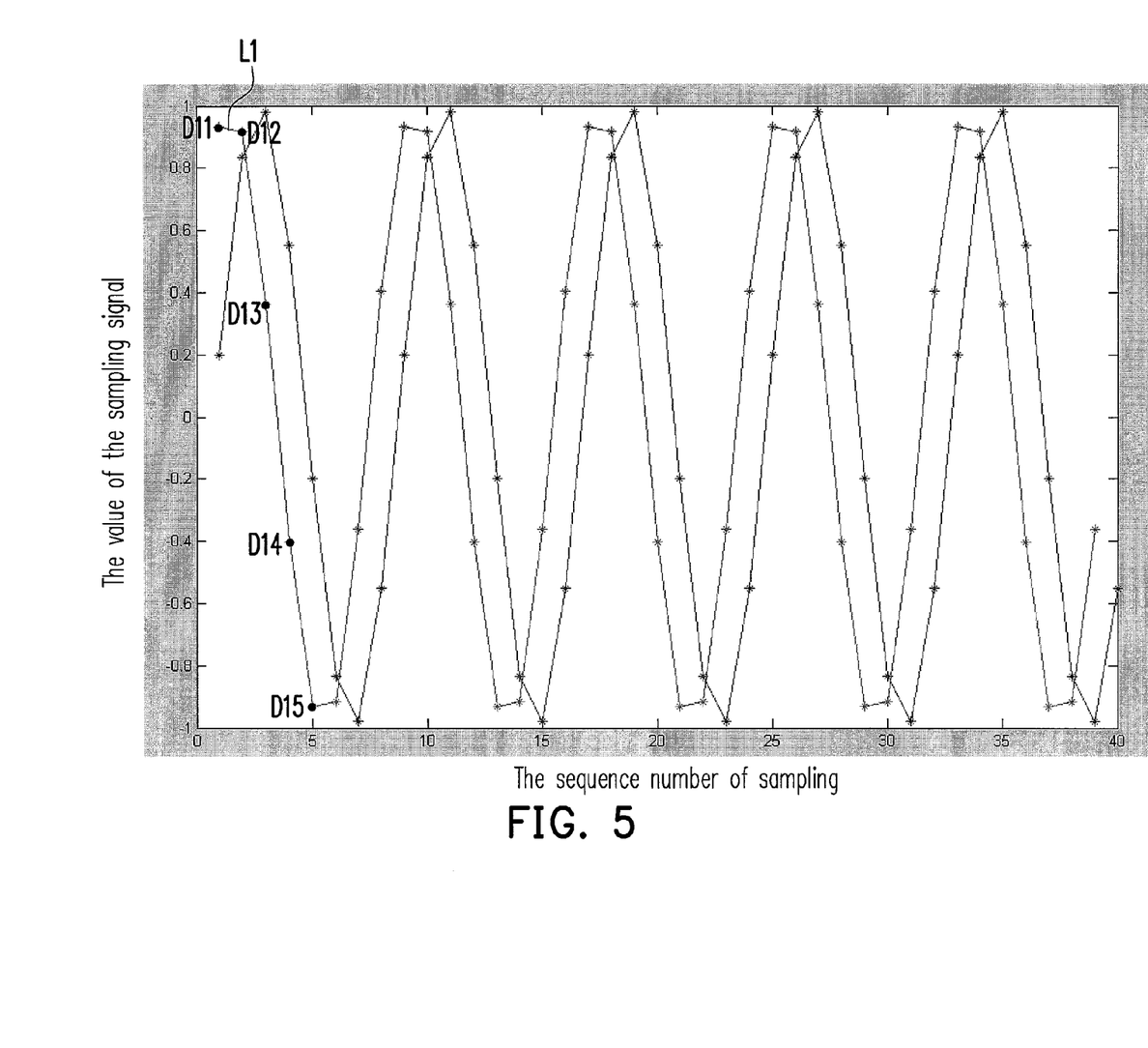
FIG. 5 is a diagram explaining the sum of absolute difference according to an embodiment of the present invention.

The operation flow of step S310 of the embodiment is depicted in detail as following. Referring to FIGS. 2 and 3, in step S311, the analog signal detection unit 250 finds out a maximum high-frequency phase phM, wherein the ADC-PLL 210 samples the analog image signal AIS according to the maximum high-frequency phase phM, and the sum of absolute difference (SAD) between the sampling results by using the maximum high-frequency phase phM is the maximum, wherein M is an integer $1 \leq M \leq 32$. In more details, the operation flow of step S311 can refer to FIG. 4. FIG. 4 is a method flow chart of step S331 of FIG. 3. First in step S410, the control unit 240 sets the sampling phase with a second preset phase value (in the embodiment, the second preset phase value is sampling phase ph1). Next in step S420, the ADC-PLL 210 samples the analog image signal AIS according to the sampling phase ph1 and the analog signal detection unit 250 calculates the SAD between the sampling results. The calculation of the SAD can refer to FIG. 5. FIG. 5 is a diagram explaining the sum of absolute difference according to an embodiment of the present invention. Since the ADC-PLL 210 transfers the obtained sampling results (referring to the curve L1 in FIG. 5) to the analog signal detection unit 250, the analog signal detection unit 250 makes subtractions on the sampling results D11-D15, takes the absolute values of the subtraction results and summarizes the absolute values so as to obtain the SAD $SAD_{ph1}$. The calculation is expressed by formula (1):

$$SAD_{ph1}=|D11-D12|+|D12-D13|+|D13-D14|+|D14-D15|+\ldots| \quad (1)$$

Then in step S430 of FIG. 4, the control unit sequentially changes the sampling phase so as to use the analog signal detection unit 250 sequentially obtaining the SAD corresponding to each sampling phase. Further in step S440, the control unit 240 finds out the SAD $SAD_{phm}$ with the maximal value and selects the corresponding sampling phase as a maximum high-frequency phase phM.

Continuing to FIG. 3, after obtaining the maximum high-frequency phase phM, the flow enters to step S312. The control unit 240 uses the motion-detecting unit 230 to obtain a number of motion pixels $MPC_{phM}$ corresponding to the maximum high-frequency phase phM (i.e., an example of the number of motion data $MDC_{phM}$). In the embodiment, the ADC-PLL 210 firstly conducts sampling on the analog image signal AIS according to the maximum high-frequency phase phM so as to obtain a first digital image IM1 and a second digital image IM2. The analog signal detection unit 250 saves the first digital image IM1 into the storage unit 220 and transfers the second digital image IM2 to the motion-detecting unit 230. The motion-detecting unit 230 makes every pair of the pixel data with the same horizontal position and the same vertical position in the first digital image IM1 and the second digital image IM2 subtractions by each other (two pixel data in a pair are subtracted by each other) so as to calculate the quantity of cases for obtaining the number of motion pixels $MPC_{phM}$ corresponding to the maximum high-frequency phase phM, wherein the case means the difference between the pixel data of the two digital signals is greater than a first threshold TH1 (i.e., to calculate the motion quantity of the pixels).

Then in step S315, the control unit 240 judges whether or not the maximal SAD $SAD_{phM}$ is greater than a third threshold TH3 (i.e., judging whether the analog image signal AIS is a high-frequency signal) and whether or not the number of motion pixels $MPC_{phM}$ corresponding to the maximum high-frequency phase phM is less than a fourth threshold TH4 (i.e., judging whether or not the difference between each period of the analog signal AS is less than the evaluation value). When it is judged 'yes', the calibration on the sampling phase is started; otherwise, the flow goes back to step S311 to continue detecting an appropriate analog image signal AIS serving as the ground for sampling phase calibration.

Continuing to FIG. 2 and FIG. 3, after the appropriate analog image signal AIS is obtained by detection in step S310, the flow enters step S320 where the control unit 240 sets the sampling phase with a first preset phase value. In the embodiment, the first preset phase value is a preset phase ph1. Then in step S330, the ADC-PLL 210 conducts sampling on the analog image signal AIS according to the sampling phase ph1 so as to produce a plurality of digital images. In the embodiment, the ADC-PLL 210 samples the analog image signal AIS twice according to the sampling phase ph1 so as to produce the first digital image IM1 and the second digital image IM2, wherein the first digital image IM1 is saved into the storage unit 220 and the second digital image IM2 is transferred to the motion-detecting unit 230. Each digital image includes a plurality of pixel data. In other embodiments, the ADC-PLL 210 can conduct multiple samplings on the analog image signal AIS according to the sampling phase ph1, which is advantageous in more definitely knowing the influence of clock jitter on the sampling, and it is omitted to describe.

After obtaining the first digital image IM1 and the second digital image IM2, the flow enters to step S340. The motion-detecting unit 230 makes every pair of the pixel data with the same horizontal position and the same vertical position in the first digital image IM1 and the second digital image IM2 subtractions by each other (two pixel data in a pair are subtracted by each other) so as to calculate the quantity of cases for obtaining the number of motion pixels $MPC_{ph1}$ corresponding to the sampling phase ph1, wherein the case means the difference between the pixel data of the two digital signals IM1 and IM2 is greater than a first threshold TH1 (i.e., to calculate the motion quantity of the pixels).

After that in FIG. 3, in step S350, the control unit 240 changes the sampling phase in the ADC-PLL 210, and by using step S330 and step S340 the number of motion pixel $MPC_{phi}$ corresponding to each sampling phase phi is obtained, wherein i is an integer and $1 \leq i \leq 32$. Then in step S360, the control unit 240 selects the sampling phase corresponding to the minimum number of motion pixel $MPC_{phi}$ or the sampling phase phi corresponding to the number of motion pixel $MPC_{phi}$ less than a second threshold TH2 as an optimal sampling phase. In this way, the ADC-PLL 210 can conduct correct sampling on the analog image signal AIS by using the optimal sampling phase and reduce the influence of clock jitter to the minimum. If there are many sampling phases phi meeting the condition of the optimal sampling phase, the control unit 240 chooses the middle phase from the above-mentioned sampling phases phi meeting the condition and sets the middle phase as the optimal sampling phase.

Figure 6:
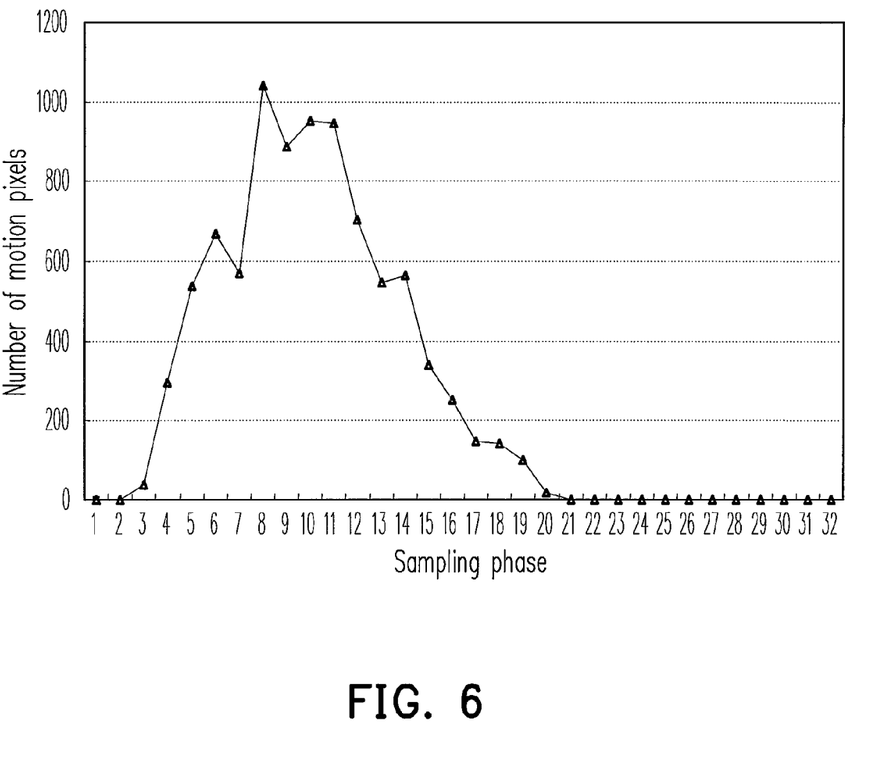
FIG. 6 is a curve plot of the numbers of motion pixels corresponding to sampling phases obtained on a 576i analog signal according to an embodiment of the present invention.

In following, some real data are given to depict steps S350 and S360 of the embodiment. Assuming the analog image signal AIS is an image signal with 576i format, wherein '576' represents there are 576 horizontal scan lines in the vertical direction and represents an interlaced scan display mode. The obtained number of motion pixel $MPC_{phi}$ corresponding to each sampling phase phi in the embodiment are shown by FIG. 6. FIG. 6 is a curve plot of the numbers of motion pixels $MPC_{phi}$ corresponding to sampling phases obtained with a 576i analog image signal AIS according to an embodiment of the present invention. The abscissa of FIG. 6 is the value of i of the sampling phase phi, wherein $1 \leq i \leq 32$. The ordinate of FIG. 6 represents the number of motion pixels $MPC_{phi}$ corresponding to each sampling phase phi. It can be seen from FIG. 6 that the sampling phase phi corresponding to the minimum number of motion pixels $MPC_{phi}$ should be the sampling phases ph21-ph32. Hence, in step S360, the middle sampling phase ph26 (or sampling phase ph27) should be set as the optimal sampling phase.

Figure 7:
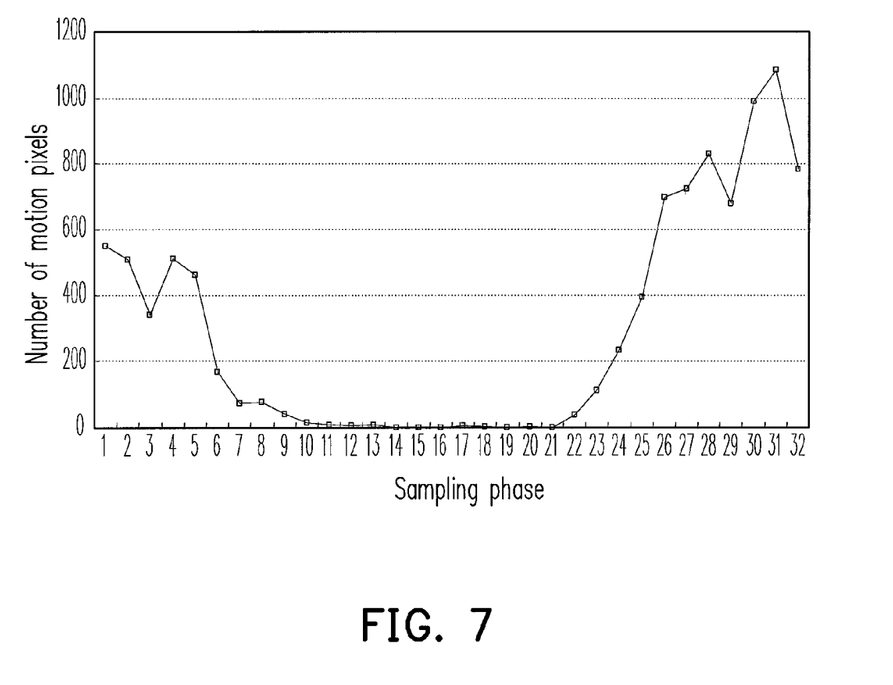
FIG. 7 is a curve plot of the numbers of motion pixels corresponding to sampling phases obtained on a 1080i analog signal according to an embodiment of the present invention.

In another embodiment, assuming the analog image signal AIS is a high definition image signal with 1080i format, the numbers of motion pixels $MPC_{phi}$ corresponding to each sampling phase phi in the embodiment are shown in FIG. 7. FIG. 7 is a curve plot of the numbers of motion pixels corresponding to sampling phases obtained on a 1080i analog signal AIS according to an embodiment of the present invention. It can be seen from FIG. 7 that the sampling phase phi corresponding to the number of motion pixels $MPC_{phi}$ less than the second threshold should be ph1-ph21. Hence in step S360, the middle sampling phase phi should be set as the optimal sampling phase for achieving the optimal sampling quality.

In summary, in the embodiment of the present invention, a same sampling phase is used to conduct multiple samplings on a static and high-frequency component video/PC signal so as to produce a plurality of periodic digital signals. The motion-detecting unit calculates the number of motion data that the difference between the pixel data with same corresponding positions between two adjacent input images is considerable large. Then, the control unit changes the sampling phase so that every sampling phase has a number of motion data and selects the sampling phase corresponding to the minimum number of motion data or one of the sampling phases respectively corresponding to a number of motion data less than a threshold as an optimal sampling phase. In this way, the ADC-PLL can correctly sample the analog signal by using the optimal sampling phase. As a result, the influence of clock jitter is reduced to the minimum.

It will be apparent to those skilled in the art that the descriptions above are several preferred embodiments of the present invention only, which does not limit the implementing range of the present invention. Various modifications and variations can be made to the structure of the present invention without departing from the scope or spirit of the invention.

What is claimed is:

1. A method of sampling phase calibration, suitable for an analog-to-digital converter and phase lock loop, the method comprising:
setting the sampling phase with a first preset phase value;
sampling a periodic analog signal according to the sampling phase to produce a plurality of digital signals, wherein each of the digital signals comprises a plurality of pixel data;
calculating the quantity of cases so as to obtain a number of motion data corresponding to the sampling phase, wherein the case means the difference between the pixel data with same corresponding positions among the digital signals is greater than a first threshold;
changing the sampling phase to obtain the number of motion data corresponding to each sampling phase; and
selecting the sampling phase corresponding to the minimum number of motion data or one of the sampling phases respectively corresponding to a number of motion data less than a second threshold as an optimal sampling phase.

2. The method of sampling phase calibration as claimed in claim 1, further comprising:
detecting the analog signal, and starting calibration on the sampling phase when the analog signal is a high-frequency signal and the difference of the analog signal between each of the periods is less than an evaluation value.

3. The method of sampling phase calibration as claimed in claim 2, wherein the step of detecting the analog signal comprises:
finding out a maximum high-frequency phase, wherein the analog signal is sampled according to the maximum high-frequency phase and the sampling makes an sum of absolute difference between the obtained sampling results the maximum;
obtaining the number of motion data corresponding to the maximum high-frequency phase; and
staring calibration on the sampling phase when the maximal sum of absolute difference is greater than a third threshold and the number of motion data is less than a fourth threshold.

4. The method of sampling phase calibration as claimed in claim 3, wherein the step of finding out the maximum high-frequency phase comprises:
setting the sampling phase with a second preset phase value;
sampling the analog signal according to the sampling phase and calculating the sum of absolute difference between the sampling results;
changing the sampling phase to obtain the sum of absolute difference corresponding to each sampling phase; and
selecting the sampling phase corresponding to the maximal sum of absolute difference as the maximum high-frequency phase.

5. The method of sampling phase calibration as claimed in claim 1, wherein the analog signal is an analog image signal, the digital signal is a digital image signal, and the pixel data with the same corresponding positions among the digital signals are the pixel data with the same horizontal and vertical positions among the digital image signal.

6. A sampling phase calibration device, coupled to an analog-to-digital converter and phase lock loop, wherein the analog-to-digital converter and phase lock loop conducts sampling on an analog signal periodically input according to the sampling phase so as to produce a plurality of digital signals, and each digital signal includes a plurality of pixel data; the sampling phase calibration device comprising:
a storage unit, for receiving and saving the pixel data;
a motion-detecting unit, coupled to the storage unit to calculate the quantity of cases so as to obtain a number of motion data corresponding to the sampling phase, wherein the case means the difference between the pixel data with same corresponding positions among the digital signals is greater than a first threshold; and
a control unit, coupled to the motion-detecting unit for changing the sampling phase so as to obtain the number of motion data corresponding to each sampling phase and selecting the sampling phase corresponding to the minimum number of motion data or one of the sampling phases respectively corresponding to a number of motion data less than a second threshold as an optimal sampling phase.

7. The sampling phase calibration device as claimed in claim 6, further comprising:
an analog signal detection unit, coupled to the storage unit, the motion-detecting unit and the control unit for detecting the analog signal, wherein the control unit starts calibration on the sampling phase when the analog signal is a high-frequency signal and the difference of the analog signal between each of the periods is less than an evaluation value.

8. The sampling phase calibration device as claimed in claim 7, wherein the analog signal detection unit finds out a maximum high-frequency phase so as to sample the analog signal according to the maximum high-frequency phase and makes an sum of absolute difference between the obtained sampling results the maximum, the sampling phase calibration device obtains the number of motion data corresponding to the maximum high-frequency phase, and when the maximal sum of absolute difference is greater than a third threshold and the number of motion data is less than a fourth threshold, the control unit starts calibration on the sampling phase.

9. The sampling phase calibration device as claimed in claim 8, wherein the sampling phase calibration device sets the sampling phase with a second preset phase value and samples the analog signal according to the sampling phase so as to calculate the sum of absolute difference between the sampling results, changes the sampling phase to obtain the sum of absolute difference corresponding to each of the sampling phases and selects the sampling phase corresponding to the maximal sum of absolute difference as the maximum high-frequency phase.

10. The sampling phase calibration device as claimed in claim 6, wherein the analog signal is an analog image signal, the digital signal is a digital image signal, and the pixel data with the same corresponding positions among the digital signals are the pixel data with the same horizontal and vertical positions among the digital image signal.

* * * * *